United States Patent
Bolanos et al.

[11] Patent Number: 5,955,115
[45] Date of Patent: *Sep. 21, 1999

[54] PRE-PACKAGED LIQUID MOLDING FOR COMPONENT ENCAPSULATION

[75] Inventors: Mario A. Bolanos, Plano; Jeremias L. Libres, Dallas; George A. Bednarz, Plano, all of Tex.

[73] Assignee: Texas Instruments Incorporated, Dallas, Tex.

[*] Notice: This patent issued on a continued prosecution application filed under 37 CFR 1.53(d), and is subject to the twenty year patent term provisions of 35 U.S.C. 154(a)(2).

This patent is subject to a terminal disclaimer.

[21] Appl. No.: 08/646,738

[22] Filed: May 3, 1996

Related U.S. Application Data

[62] Division of application No. 08/434,335, May 2, 1995, abandoned.

[51] Int. Cl.[6] .......................... B29C 31/06; B29C 45/02; B29C 45/14
[52] U.S. Cl. .................... 425/116; 264/272.17; 425/121; 425/129.1; 425/544; 425/588
[58] Field of Search ............................... 425/89, 98, 116, 425/121, 129.1, 544, 588, DIG. 228; 264/272.17, 338; 249/115

[56] References Cited

U.S. PATENT DOCUMENTS

| | | | |
|---|---|---|---|
| H1654 | 6/1997 | Rounds | 425/89 |
| 4,629,650 | 12/1986 | Kataoka | 264/338 |
| 4,761,257 | 8/1988 | Bunn | 264/338 |
| 4,983,110 | 1/1991 | Yoshida et al. | 425/544 |
| 5,043,199 | 8/1991 | Kubota et al. | 428/76 |
| 5,098,626 | 3/1992 | Pas | 264/151 |
| 5,108,278 | 4/1992 | Tsutsumi et al. | 425/116 |
| 5,269,997 | 12/1993 | Leslie | 264/338 |
| 5,431,854 | 7/1995 | Pas | 264/328.5 |
| 5,435,953 | 7/1995 | Osada et al. | 264/272.17 |

FOREIGN PATENT DOCUMENTS

| | | |
|---|---|---|
| 442152 | 8/1991 | European Pat. Off. . |
| 2 103 917 | 4/1972 | France . |
| 02-260438 | 10/1990 | Japan . |
| 6-71686 | 3/1994 | Japan ..................... 425/588 |

*Primary Examiner*—Robert Davis
*Attorney, Agent, or Firm*—Mark E Courtney; W James Brady III; Richard L Donaldson

[57] ABSTRACT

A method and apparatus for encapsulating an integrated circuit die and leadframe assembly using liquid mold compound. A prepackaged liquid mold compound insert 11 is placed in a rectangular receptacle 43 in a bottom mold chase 31. The receptacle 43 is coupled to a plurality of die cavities 37 by runners 39. Leadframe strip assemblies containing leadframes, integrated circuit dies, and bond wires coupling the leadframes and dies are placed over the bottom mold chase 31 such that the integrated circuit dies are each centered over a bottom mold die cavity 35. A top mold chase 53 is placed over the bottom mold chase 31 and the mold compound package 11. The top mold chase 53 has die cavities 57 corresponding to those in the bottom mold chase 31. The prepackaged liquid mold compound is packaged in a plastic film which has heat sealed edges 15. The mold compound is forced through the heat seals 15 during the molding process by the pressure applied by a rectangular plunger 61. The plunger is applied using variable speed and pressure to control the rate the mold compound fills the cavities in the top and bottom mold chases, thereby avoiding voids in the completed packages and minimizing wire sweep of the bond wires of the integrated circuit assemblies.

10 Claims, 5 Drawing Sheets

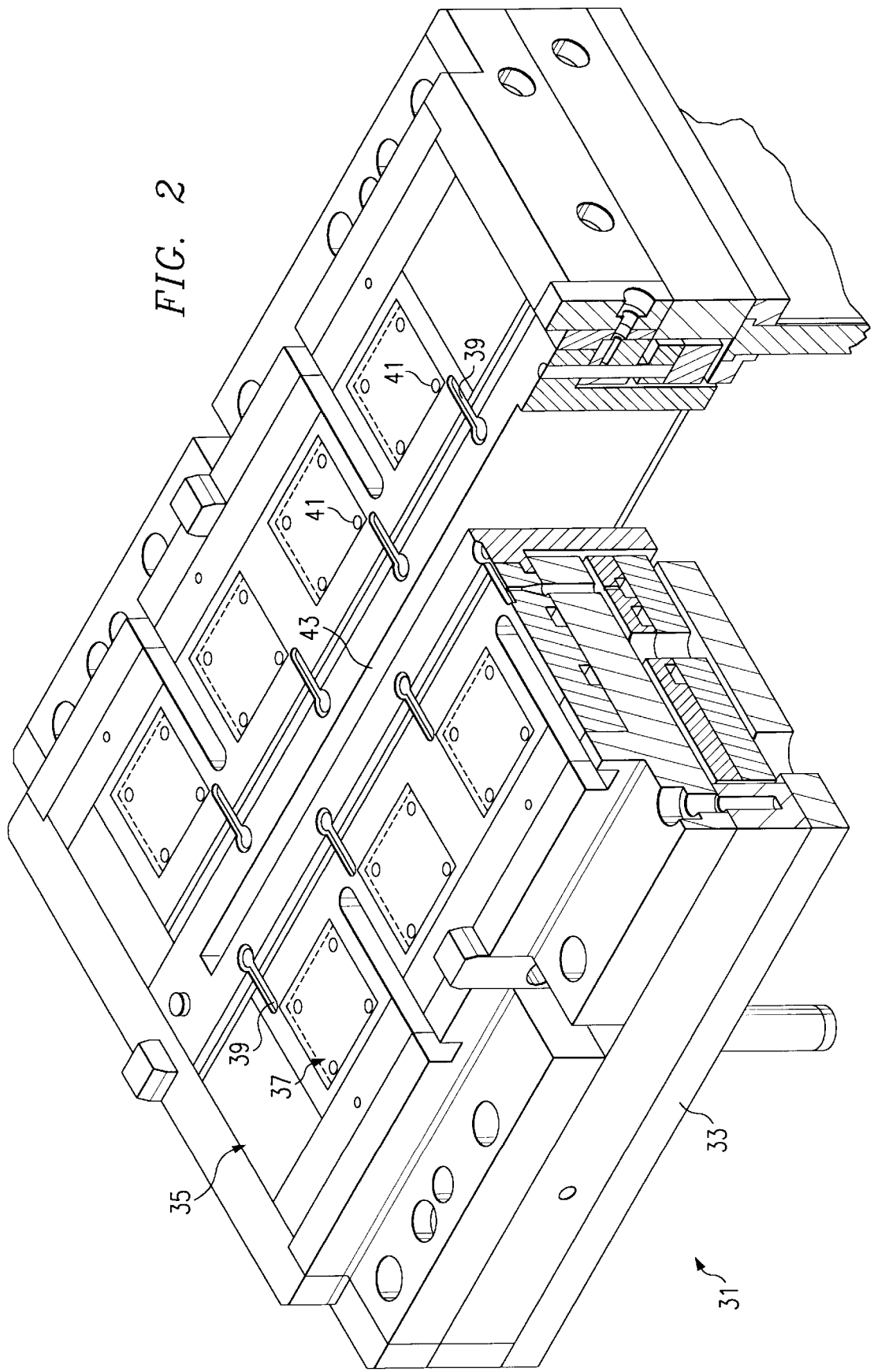

PRE-PACKAGED LIQUID MOLDING FOR COMPONENT ENCAPSULATION

This is a Divisional of application Ser. No. 08/434,335, filed May 2, 1995 and now abandoned.

FIELD OF THE INVENTION

This invention relates generally to the field of integrated circuits and the encapsulation packaging of integrated circuits using transfer molding techniques.

BACKGROUND OF THE INVENTION

In producing integrated circuits, it is desirable to provide packaged integrated circuits having plastic, epoxy or resin packages which encapsulate the die and a portion of the lead frame and leads. These packages have been produced a variety of ways, a few of which will be described here.

Conventional molding techniques take advantage of the physical characteristics of the mold compounds. For integrated circuit package molding applications, these compounds are typically thermoset compounds. These compounds consist of an epoxy novolac resin or similar material combined with a filler, such as alumina, and other materials to make the compound suitable for molding, such as accelerators, curing agents, fillers, and mold release agents.

The transfer molding process as known in the prior art takes advantage of the viscosity characteristics of the molding compound to fill cavity molds containing the die and leadframe assemblies with the mold compound, which then cures around the die and leadframe assemblies to form a hermetic package which is relatively inexpensive and durable, and a good protective package for the integrated circuit.

Transfer molding operations have three stages which correspond to the three phases of viscosity of thermoset mold compounds. First there is a preheat stage required to move the mold compound from its hard initial state to the low viscosity state. Second is a transfer stage, where the compound is low in viscosity and easily transported and directed into cavities and runners. This transfer process must be rapid and be completed before the mold compound begins to set. Finally there is a cure stage that occurs following the transfer stage.

There are several critical requirements that must be met in a commercially successful package molding operation. The cavities must be completely and uniformly filled. Using the single plunger mold systems of the prior art the cavity fill stage is difficult to perform uniformly across such a large mold using the single pot and the long primary runners to transport the mold compound. A problem commonly observed in a single plunger single pot mold operation using a single pot transfer mold is an unacceptable void rate. Voids are areas within the mold cavity that are not filled with compound. These can be areas where the compound fails to flow or where air or other materials are trapped and cause hollow spaces in the packaged part. Voids can be produced if the transfer rate of the mold compound is too slow during the molding process or if air or moisture is trapped in one or more the cavities during the transfer stage.

A second critical requirement is that the wire sweep defect rate be minimized below an acceptable level. Wire sweep occurs as the mold compound enters the cavity through the gates. The mold compound is dense and pulls at the fine wires that couple the bond pads of the die to the leads of the lead frame. These wires will bend under the pressure due to the flow of mold compound. As an example, suppose that in a typical lead frame and die assembly, an average wire sweep of less than 6% is specified. A straight line from the lead frame lead to the bond pad has a sweep of 0%. So if after assembly and mold any wires on a packaged unit are found to have more than 6% sweep, the unit is out of specification, and is considered to be a bad unit. Wire sweep is specified as a maximum allowable parameter and is a big concern in production of integrated circuits, because if the bond wires are moved too much, a wire short between two or more adjacent bond wires often occurs. Alternatively, bond wires sometimes break away. Either condition results in a faulty unit.

Although the wire sweep defect rate which is observed in the single plunger molding presses is adequate for producing low to moderate pin count DIP and flat quad packaged devices, as the device pin counts continue to increase and lead frames become finer in lead to lead pitch, the wire sweep parameter becomes increasingly critical. While it is possible to build 200 pin flat quad devices using these techniques, as the pin count goes towards 400 pins the prior art transfer molding presses using a single mold pot will no longer be economically suitable, due to the low yield and high wire sweep defect rates.

A further disadvantage with a single plunger mold and pellet compound arrangement is that the performance in the two critical areas are inversely dependent on each other. That is, in attempting to perfect the molding process using a single plunger mold, it has been observed that steps taken to reduce wire sweep defects typically increase the void rate, and vice versa. In other words, if the wire sweep defect rate is lowered the void rate tends to increase. The wire sweep rate can be lowered, for example, by slowing the transfer rate of the mold compound into the cavities. This tends to increase the void rate. Voids can be reduced by increasing the flow rate into the cavities, but this will tend to increase the wire sweep defect rate.

It has been further observed that the wire sweep and void problems tend to be more severe as the number of cavities and the distance of runners increases. Nonuniform fill can occur along a long runner having many cavities. The cavity closest to the pot will have a faster fill rate than the others. The cavity farthest from the pot will tend to fill at the end of the transfer period, and the rate will be lower because a lot of the compound has been diverted to other cavities and because the compound is starting to harden. As a result, difficult and time consuming fine tuning of each mold press is required to establish an operation mode which will fill all of the cavities at an acceptable rate, during the low viscosity period, without increasing wire sweep defects to an unacceptable level, particularly for the near and far cavities.

Further, the use of the thermoset molding compound results in a process where the sprue, flash or waste that is left in the pot, the runners and between the devices themselves cannot be reused. Thermoset materials can only be used once in a molding operation, so the excess material must be discarded.

Also, the conventional molding compound acts as a strong abrasive. During molding, the mold compound is forced out of the mold pot and into the primary runners. The abrasive nature of the mold compound results in rapid wear of the mold pot and the runners, and the plunger or ram itself. This results in expensive rework or replacement of the mold chases on a frequent basis.

An alternative approach to the single plunger molding presses of the prior art is to construct a multipellet, multiplunger mold station to replace the single plunger system. In operation, each of the mold pots receives a so called "mini-pellet" of mold compound. The press is a more complex press and has a plunger for each of the mold pots. The plungers may operate from the top or from underneath the mold. Each mold pot and the short runners act exactly as the single plunger mold system in operation. The individual plungers are used to start the transfer process, the cavities fill with mold compound as the plunger is pushed into the mold pot, and the transfer phase is completed in a few seconds.

The multiplunger mold process has some advantages over the single pot molding process. The use of the smaller pellets and the shorter runs eliminate the long runners and nonuniform fill times associated with a single plunger press. The pellets used are smaller and therefore do not require preheating, as the mold platens can provide sufficient heat to transition the mini-pellets into the low viscosity state. The wire sweep defect rate can be lowered by providing exact control of the plunger or ram insertion rate, so that the fill is done at a speed which prevents voids while minimizing wire sweep problems. An automated multiplunger press can vary the operation of the plungers during the transfer stage to obtain optimal results.

The nonuniform fill and wire sweep problems associated with the cavities nearest and farthest from the single center pot of the single plunger mold presses are eliminated. Mold compound waste is reduced by the shorter runners.

The disadvantages of the multiplunger molding process are primarily that the process requires the use of the mini-pellets. The mini-pellet form of the molding compound is far more expensive than per kilogram than the single large pellets used by the single transfer mold. Also, the multi-plunger molding station is extremely expensive to manufacture, operate and maintain. The automation of a press with so many plungers is more complex and expensive than the single mold press.

In addition to the added costs, the need for many plungers and pellets results in a molding station that has a lower parts per hour throughput than for a conventional single pot mold press. Also the multiple plunger molding system requires complex control and loading and unloading mechanisms. The result is that each station has lower overall throughput than a single plunger mold station, although tighter process control can be achieved. Because the throughput is lowered, additional stations are needed to maintain the same relative level of productivity. High productivity is required to keep the per unit costs low. The need for additional expensive and complex molding stations increases the cost disadvantages for the multiplunger molding systems.

Both single plunger and multiplunger mold presses have other disadvantages that are common. The mold compound is an abrasive material. The mold pot and the primary runners receive an abrasive force each time the press is operated. These areas wear quickly and the expensive mold chases must be replaced periodically as a result.

Also, both processes require pelletized mold compound. This material is fairly difficult to produce in the large form, and even more expensive to produce in the minipellet form. The compound is extruded into a rod, which is powdered, and the powder is then pelletized. This is an expensive and complex manufacturing process.

Both pellets and mini-pellets are subject to contamination by moisture and air. It is necessary to perform the molding process under pressure to eliminate trapped air and prevent the formation of voids. Moisture can become trapped in either form of pellet. Moisture contamination of the molding compound can result in additional voids and scrapped devices. Moisture contamination also contributes to package cracking during cure and afterwards to early failure of devices.

U.S. Pat. No. 5,098,626, issued Mar. 24, 1992, and entitled "Method for Packing a Measured Quantity of Thermosetting Resin And Operating a Mold for Encapsulating a Component", and herein incorporated by reference, provides another alternative wherein the mold compound is packaged in individually sealed units. These units each contain mold compound in a quantity needed for a single cavity or pair of cavities for integrated circuit packages. Each of these units is a bag or tube containing mold compound and ending in a bulge or sprout. During molding the bulge or sprout is placed at the end of a runner which feeds a cavity. The sprout is cut and the mold compound is pressed out of the bag into the cavity by individual, multiple plungers.

The '626 patent approach is similar to a multiplunger mold system in that small quantities of mold compound, each of which are individually loaded, are provided. The patent provides a moisture and contamination free packaging system which can be used with an automated loading system. However, like the mini-pellets, many of these bags are required for each run. The abrasion problems are reduced, because the pots and plungers are protected by the packaging. Also, improved uniform fill and reduced wire sweep are possible. But the throughput problems and increased expense for each molding station remain, and the costs for each press are increased further by the added complexity. Also, the packaging of the mold compound in small quantities each in an individual package may lead to an expensive raw material for molding.

In addition to these problems, additional problems have been identified with the prior art molding processes in relation to new package designs. Packages are becoming thinner, and therefore the reduction of wire sweep is complicated by so called low wire loop packages. In these packages the bond wires are kept relatively flat in the path from the die to the lead frame leads. Further, because the packages are thinner, the pad and die must stay aligned, that is, little or no tilting of the pad can occur during molding, or the edge of the die or pad may be exposed after packaging in the thin or flat packages. The wire sweep requirements become even more stringent as the pin count rises and the pitch between bond pads and bond wires is reduced. It is believed that conventional molding compounds may not be able to meet the requirements for reduced wire sweep, pad tilt, and low void rates needed for future high pin count, thin packages.

A desirable alternative to the solid mold compound processes is to use a liquid molding compound. The use of liquid molding compound allows for compounds to be used that are not available for the traditional solid pellet transfer molding process. High filler content compounds can be used. Epoxy and other compounds can be used, such as adhesives. The compound can be clear for use with photo-sensitive or photoemitting devices such as photodiodes, LEDs, CCDs, etc.

Prior art processes for using a liquid mold compound are so-called radial spread, gravity feed, or surface dispensing processes. However, these methods require the use of liquid mold dispensers or syringes which have several disadvantages. First the syringes or dispensers used are very expensive to produce compared to the solid pellets of the transfer molding art. Second the dispensers provide less process control than is available with the plunger molds. The '626 patent sprouted bag could be used with liquid molding compound, but it requires a customized molding station to provide the loading and cutting steps required to load the bags or packets, and automated cutters are required in the molding station to cut the sprout to start the flow of the molding compound.

Accordingly, a need thus exists for a liquid mold compound molding system which eliminates the problems of the prior art liquid molding systems while retaining a high part throughput rate, low raw material costs, and which is simple to operate, maintain, and uses molding stations that are relatively inexpensive to build. The new system should be compatible with existing single pot transfer mold presses to allow a retrofitting of existing integrated circuit assembly lines. The system should provide for a cost effective liquid molding process. The new molding system must provide uniform cavity fill and reduced wire sweep defect rates over the molding systems of the prior art.

SUMMARY OF THE INVENTION

A system for transfer molding the packages of integrated circuits using liquid mold compound prepackaged in a protective plastic is provided. The mold compound is packaged in a plastic packaging that is sealed at the edges by a heat peelable seal. As the package is heated in the mold the edge seals become flexible. The mold compound can then be pushed through the edge seals at places adjacent to the mold runners during the transfer molding process. The protective packaging ensures that the mold compound is free from moisture and air contamination and is easily produced, stored and shipped.

An improved mold design is used in combination with the new mold compound inserts. The mold chases include rectangular receptacles for receiving the pencil shaped inserts of prepackaged liquid mold compound. A rectangular plunger is provided for each of the receptacles. Each package cavity is equidistant from the receptacle containing the mold compound, providing improved uniformity of fill and allowing for complete fill of the cavities with reduced wire sweep as compared to the transfer molds of the prior art. The rectangular plunger is inserted and forced against the prepackaged mold compound, and the mold compound is forced through the edge seals of the protective packaging into short runners coupling the mold receptacle to the cavities. The mold compound then hardens and completes the molding process.

The mold compound is placed inside the mold receptacle within the protective package, so that the equipment abrasion and cleaning problems associated with conventional prior art transfer molding operations are reduced or eliminated. Since the runners are shortened, the amount of mold compound which is flash or sprue for each run is reduced, thus reducing waste and lowering production costs. The improved mold design is compatible with automated loading, molding and unloading systems for increased automation and improved throughput. The molding station requires only a few plungers and is inexpensive to build and maintain.

Existing molding equipment may be retrofitted to use the new system. The mold compound package may be automatically loaded into the mold chases by using existing autoloading equipment. The prepackaged mold compound system is easily combined with a process controller to achieve tight process control, and the use of the pencil mold system with a process controller results in a mold process with balanced cavity fill, reduced wire sweep and low void defect rates. The use of the invention allows the use of a liquid molding compound in a controlled environment, in contrast to the dispenser systems used with liquid mold compounds in the prior art.

BRIEF DESCRIPTION OF THE DRAWINGS

FIG. 2 depicts a bottom mold and chase of the mold system of the invention;

FIG. 6b depicts a top view of the step of FIG. 6a;

Corresponding numerals are used for corresponding elements in the drawings, unless otherwise indicated in the text.

DETAILED DESCRIPTION OF PREFERRED EMBODIMENTS

Figure 1:
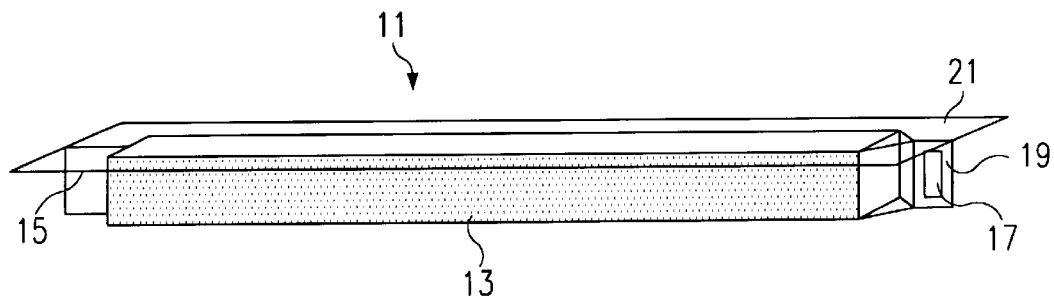
FIG. 1 depicts a prepackaged mold compound package of the invention.

FIG. 1 depicts a prepackaged mold compound insert 11 in a first preferred embodiment of the mold compound of the invention. In a first embodiment, a prepackaged mold compound insert is composed of mold compound in a liquid form. In one preferred embodiment the liquid mold compound is an epoxy. Advantageously, alternative molding compounds may be used, for example an adhesive or abrasives. The shape of the prepackaged mold compound is determined be the design of the mold being used, here a rectangular shape is shown, but any other shape can be used and should be used to advantage with different mold designs.

The mold compound material 13 is preferably packaged in a pre-packaged plastic package 11. Alternative materials would be ones that have characteristics similar to plastics. Top 21 is a piece of plastic film which is wider than the mold compound 13 and provides a lip on either side of the mold compound 13. Sleeve 17 is a second piece of plastic film that wraps around the sides and bottom of the mold compound 13 and may be sealed at the ends 19. Alternatively, the sleeve may be shaped such that ends are not readily apparent and no end sealing is required, such as a cup or bowl shape. Edges 15 are seals that couple the sleeve 17 to the top 21 using conventional heat sealing techniques for plastic packaging. Alternative sealing techniques such as ultrasonic seals, adhesives, and pressure seals can be used.

The plastic package of FIG. 1 provides the advantages of making the mold compound packages impervious to contaminants such as water that could interface with the molding process. Since the liquid prepackaged mold compound 13 is self packaged in plastic, storage and shipping packing materials may be inexpensive and no additional protective layers are needed. The protection of the mold compound from moisture prevents many of the package cracking problems and voids associated with moisture contaminated mold compound. The top 21 may be opaque and may carry labeling information in text and machine readable forms, such as bar codes or so called UPC labels. This labeling on the mold compound package 11 provides an easy mechanism for checking that the correct type of mold compound is being used for a particular packaging operation. Also, the plastic packaging affords the opportunity to use alternative mold compounds because the mold plunger and mold receptacle or pot are not in direct contact with the compound.

FIG. 2 depicts a portion of a bottom mold 31, comprising a mold chase 33 for transfer molding integrated circuit packages, such as for example DIP or flat quad type high pin count integrated circuit packages, using the mold compound package of FIG. 1. Bottom mold chase 33 holds two cavity bars 35, each of which has several die cavities 37 coupled to primary runners 39 and each cavity having a gate 41. A rectangular mold compound receptacle 43 is cut through the mold chase 33. This receptacle 43 is open at the bottom for allowing a plunger or ram to enter the mold chase and to apply pressure to a prepackaged mold compound insert resting at the top of receptacle, to force the mold compound into the cavities. A typical mold system would include two to four of these mold chase pairs, so it would have two to four receptacles 43, and cavities 37 along both sides of each receptacle. In some cases, more chases can be used, such as 6 or 8 chases in a single mold. The number of chases depends on the mold press capacity and the package type and size.

Figure 3:
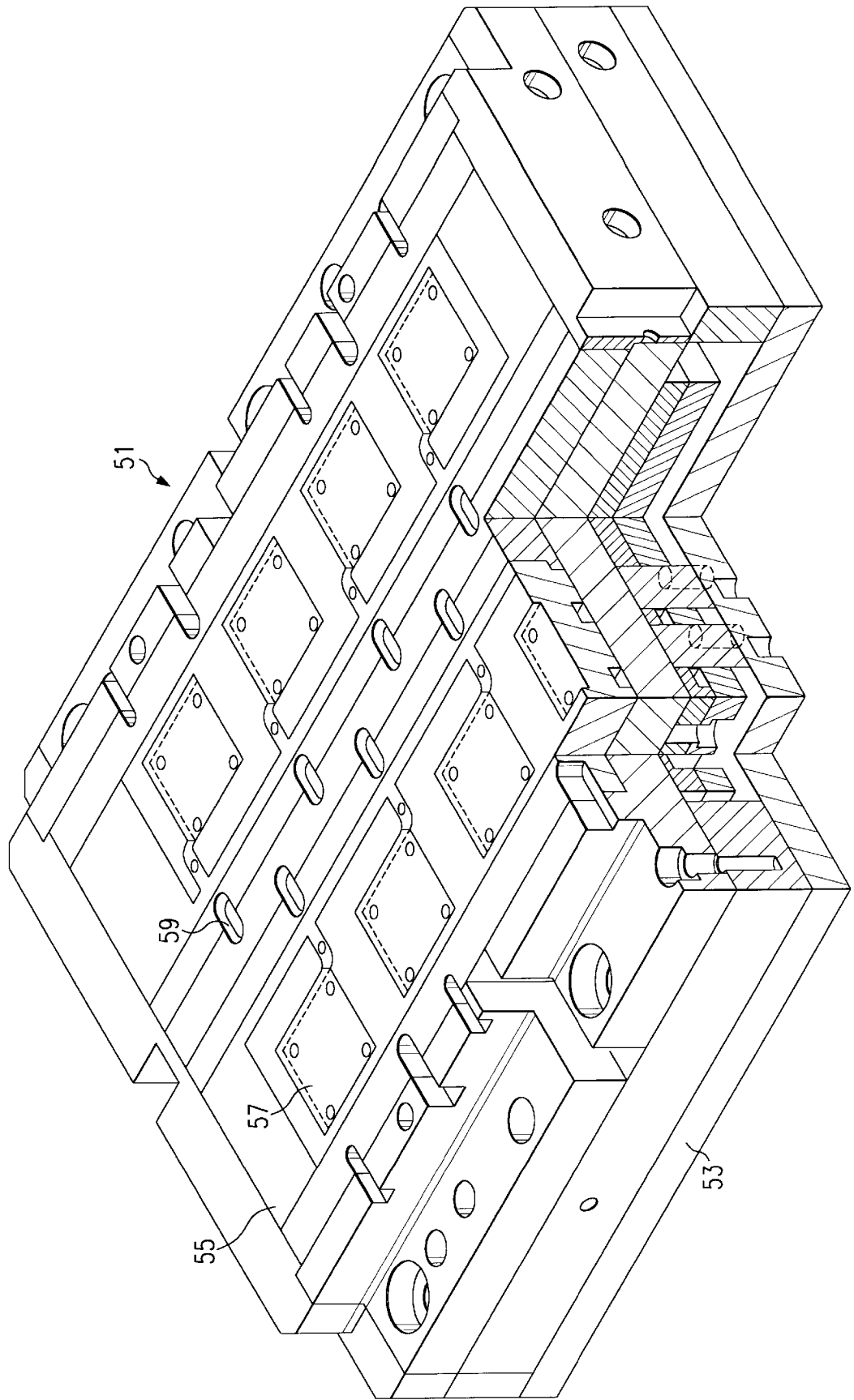
FIG. 3 depicts a top mold and chase of the mold system of the invention.

FIG. 3 depicts a portion of a top mold 51 for use with the bottom mold of FIG. 2 and the prepackaged mold compound of FIG. 1. In FIG. 3, top mold chase 53 carries top mold cavity bars 55, each of which has a row of cavities 57 which are positioned to be placed over the bottom mold chase cavities 59. Delivery runners 59 are positioned with an outer end which will meet an associated primary runner 41 in the bottom mold chase 35, and an inner end which will lie over the receptacle 43.

Figure 4:
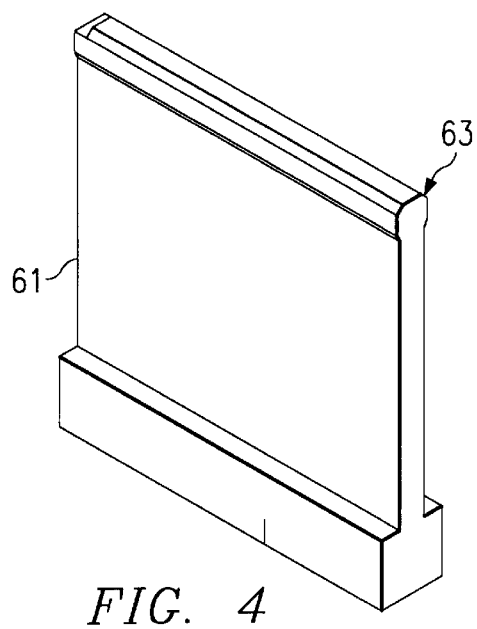
FIG. 4 depicts the plunger used with the top and bottom mold and the prepackaged mold compound of the invention.

FIG. 4 depicts the plunger which is used with the top mold chase 51 of FIG. 3 and the bottom mold chase 31 of FIG. 2. The top of plunger 61 is sized so as to fit within the receptacle 43 in the bottom mold chase 31. The top of the plunger will compress the plastic mold compound package against the top mold chase 53 in an even manner along the mold compound package. The top of plunger 61 is machined to form a tip 63. Tip 63 has two slots at the sides so that a small area at the edge of the top and sides of plunger 61 are spaced beneath the top surface a short distance. During molding, this area will compress against the sides of the plastic package 11. As the plastic package is compressed with the plunger 61, the plastic can deform into this spacing and compress further without holding the top surface of the plunger away from the top mold surface.

Figure 5:
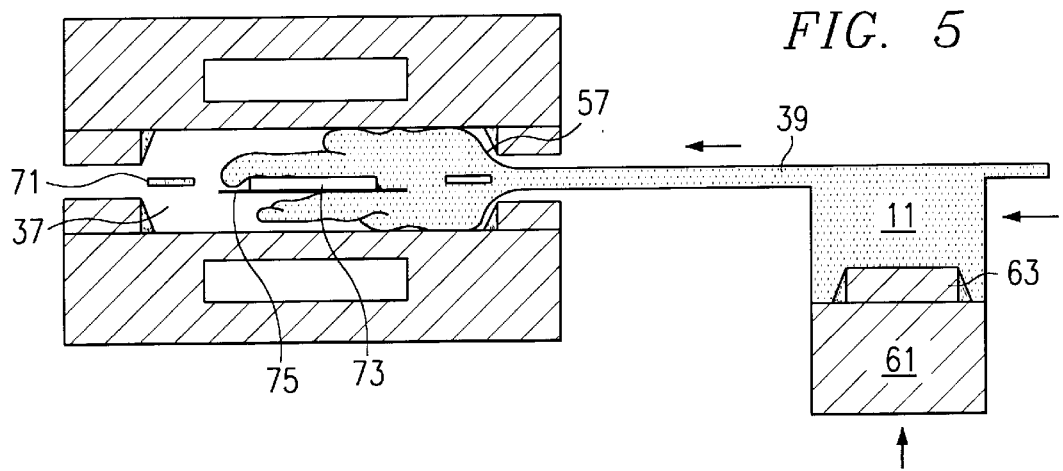
FIG. 5 depicts the molding process using the liquid mold compound package of the invention.

FIG. 5 depicts a cross sectional view of a die 73, die pad 75 and leadframe 71 assembly located in a cavity of the mold during the transfer stage, and the operation of the mold compound and plunger. The cavity is formed by the top and bottom mold chase cavities 57 and 37. Also shown is the mold compound package 11, and the plunger 61 and tip 63, all in cross section during the transfer operation.

In operation, the prepackaged molding system including the mold compound package shown in FIG. 1, the bottom mold chase of FIG. 2, the top mold chase of FIG. 3, and the plunger of FIG. 4, operates as follows. The mold is opened so that the top mold and top mold chase is separated from the bottom mold and bottom chase and the bottom mold cavity rows 35 may be accessed from above. Lead frame and die assemblies are placed over the bottom mold chases 31 such that a single leadframe and die with its bond wires is centered over each cavity 37. A liquid mold compound insert 11 is placed in each receptacle 43 in the bottom mold. These placements are preferably performed by an automatic pick and place mechanism as is known in the prior art, but alternatively may be performed manually.

After the bottom mold chases are loaded and the molding compound packages are in place in the bottom mold receptacles, the mold is closed and the top mold chases are brought into contact with the leadframe and die assemblies and the mold compound packages. Delivery runners 59 in the top mold cavity bars 55 are now positioned so that the inside ends of these runners are over the top edges of the mold compound packages.

When the mold is closed, the seal in edges 15 of the molding compound packages opens, that is the heat relaxes the seal so it is permeable. This relaxing of the seal must occur after the mold is closed, and should be fairly complete. If a sealing method other than a heat seal is used, it must provide a seal that opens in response to either heat, pressure, or both. The mold is typically heated to a temperature of 175 degrees Celsius. The heat seal relaxes at this temperature.

After the heat seals are relaxed and the mold compound enters the low viscosity state, the plunger 61 of FIG. 4 is applied. In a preferred embodiment, the plunger 61 travels through the bottom mold platen and into the bottom mold receptacles 43, compressing the mold compound packages from underneath. Alternatively, the mold compound could be compressed from above, with the receptacles formed in the top mold platen. In this case the insert would be loaded with the top plastic layer 21 down, that is adjacent the bottom mold chases. Either arrangement will work to transfer the mold compound into the primary runners.

The mold compound package is compressed by the action of the plunger and as it is compressed the mold compound will begin to push at the edges of the receptacle 43. As the only exits available to the liquid mold compound are the runners 59 in the top mold cavity bars 35, the compound will pass through the now permeable heat seal at the edge of the plastic package 11 and into the primary runners 39. The delivery runners each feed a primary runner 39 in the bottom mold cavity bars 35. A circular coupling area at the inner end of the primary runners 39 meets the outer end of the delivery runners 59, and the mold compound is transferred to the primary runners 39. The mold compound then enters the cavities 37 over the gates 41, and begins filling the individual package cavities 37.

FIG. 5 shows a cross sectional view of the transfer stage of the molding process. The operation of tip 63 can be seen, as the plastic package sides are compressed into the slots machined into the plunger 61 so that the compression can continue without interference. The compound travels into the delivery runner 59, then into the primary runner 39, over the gate 41, and into the cavity formed by the top and bottom chase cavities 57 and 37.

After the cavities are filled with the compound, the molding process continues as a conventional transfer molding process. A curing time is required to complete the packages. After the packages are cured, the top mold is moved away from the bottom mold. Plungers are activated to release the packaged devices from the cavities, and the sprue or flash is released from the runners. The mold compound package 11 is now empty, or almost so, and resting in the receptacle 43, and it too is removed. The need to clean the receptacle 43 and the plunger 61 is greatly reduced because the packaging of the invention serves to isolate the plunger and the receptacle from the mold compound.

The plungers 61 are easily controlled with a variable rate of compression to achieve a tight process control parameter during the transfer phase. This leads to uniform fill of the cavities, which are evenly spaced and equidistant from the source of the mold compound, and the transfer speed can be controlled to eliminate voids while minimizing pad tilt and wire sweep defects. The transfer speed and transfer pressure can be controlled by fitting an independent process controller circuit to the mold system to allow multi-step, variable speed and variable pressure capability. This equipment can be retrofitted to an existing mold press.

A critical element to the operation of the molding process using the prepackaged molding compound is the packaging material. The requirements for the packaging of the mold compound have been established for an integrated circuit assembly process using industrial standard requirements for molding compounds and for the resulting integrated circuit packages. The plastic package must not create residue or glue like substances in the mold during molding. The mold compound packaging must not contaminate the mold runners or receptacle. The material used in the packaging must not add to ionic contamination of the resulting packages, that is the material must not have an ionic content higher than that of the molding compounds in use in the integrated circuit packaging art. The material should not melt during the molding process, so it must have a melting temperature at least ten degrees Celsius over the molding temperatures. Typically, the material needs to have a melting point of greater than 200 degrees Celsius.

Also, the packaging material must only allow the molding compound to exit the package at selected points adjacent to the runners, and it must not open prematurely during the preheat phase of the molding operation. So the edge seals must not open and emit molding compound prematurely. However, once the edge seals are permeable the mold compound must flow out of the package with a minimum of resistance to flow. The material must not tear in normal handling or shipping, but must have the capacity to stretch into the runners when compressed during the molding process as described above. The material must be capable of vacuum sealing and of maintaining the vacuum during storage.

Although many materials may exist that could meet these requirements, it is now known that certain plastic films meet the requirements listed above. Plastic films such as those used in food storage, freezing and preparation, are particularly well suited to this application. The melting point, strength, vacuum capability and moisture and air barrier requirements for the mold compound packaging are all met by such films. The films are inexpensive and easy to purchase and use in a production environment. One preferred film is MYLAR™ polyester film, such as for example MYLAR™ XM 963-AT, a polyester film for packaging available from DuPont, DuPont de Nemours Int. S. A., Geneva, Switzerland; or DuPont (U.K.) Ltd, Maylands Avenue, GB-Hemel Hempstead, England. Another preferred film is ICI polyester film. Similar films are commercially available from a variety of vendors.

Figure 6A:
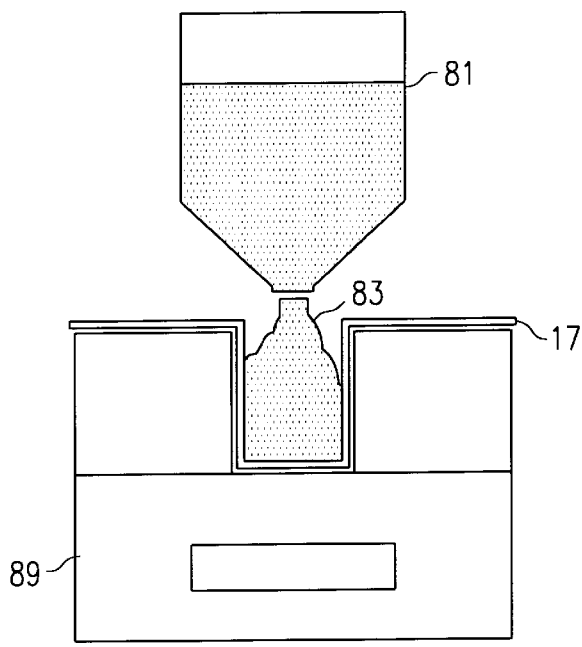
FIG. 6a depicts a cross sectional view of a first step used in making the liquid mold compound package of the invention.
Figure 6B:
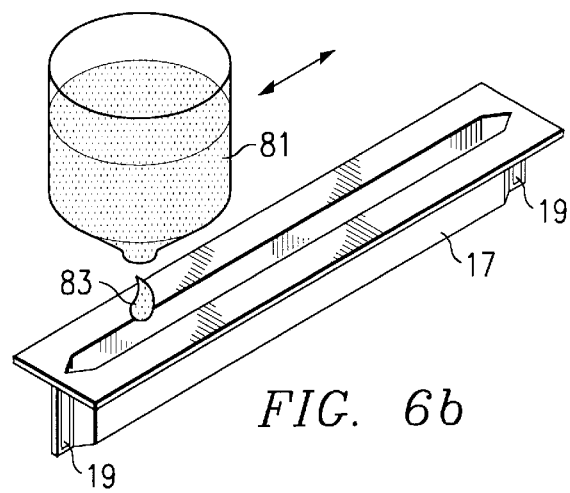

Once the appropriate material is selected, the film must be applied to the mold compound to create the necessary packaged mold compound insert. FIG. 6a and FIG. 6b show the first step in the process of making the prepackaged liquid mold compound insert 11. FIG. 6a is a cross section and includes the loading block 89. FIG. 6b is a three dimensional view shown without the loading block 89. In FIG. 6a and 6b, dispenser 81 provides a stream of liquid resin or epoxy 83 into sleeve 17, which is pre-sealed at ends 19. Sleeve 17 is supported by loading block 89 during the filling process. The dispenser may be a hopper, tube, vat or other supply source. The molding compound used can be any useful compound in liquid form, including resins, epoxies, abrasives, plastics, or other encapsulants as alternatives. Sleeve 17 is a plastic film material, preferably of a polyester plastic film.

In operation dispenser 81 provides a stream of liquid molding compound at one end of the sleeve 19 and is moved towards the other end of sleeve 19 at a predetermined rate such that the sleeve is completely filled with a predetermined amount of compound. The amount of compound needed is determined by the mold design, the number of cavities to be supplied by the mold compound packages, and the type of package being produced. The size of the sleeve 17 is then determined, so as to hold the required amount of compound. The mold chases shown in FIGS. 2 and 3 are typical, but many other arrangements will work, in which case the shape of the prepackaged plastic package 11 will also change as needed to fit the mold design used in a particular application.

Figure 7:
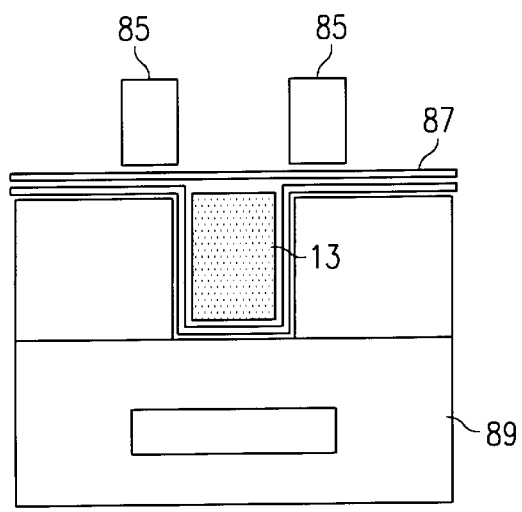
FIG. 7 depicts a second step used in making the liquid mold compound package of the invention.

FIG. 7 illustrates the next step used in making the prepackaged mold compound 11. After the liquid mold compound is dispensed, a second piece of plastic film material 87 is put into place. Sealing blocks 85 are positioned over the mold compound 13 and the sleeve 17, and positioned at a point just outside the cavity within loading block 89. A seal is now formed between the second piece of plastic film material 87 and the sleeve 17. Preferably this seal is formed by applying heat from the sealing blocks 85. Alternatives include using adhesives, ultrasonic sealing, and pressure sealing the two pieces of plastic film together.

Figure 8:
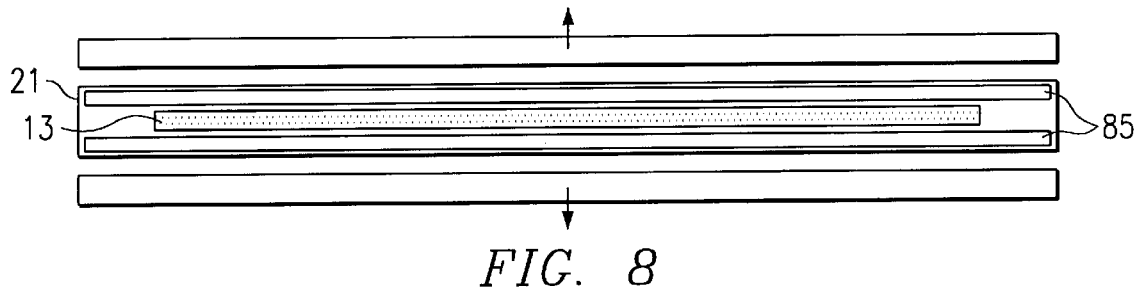
FIG. 8 depicts a third step used in making the liquid mold compound package of the invention.

FIG. 8 illustrates a top view of the final step in making the prepackaged mold compound insert 11. After the seal is formed in FIG. 7, a cutting device is used to make the top 21 of insert 11. Cuts are made outside the sealing blocks so that the top 21 forms a lip that is wider than the sleeve 17. Top 21 is then used to support the mold compound 11 in the mold receptacle during molding. The width of top 21 is therefore a function of the particular mold chase design in use for a particular packaging application.

The use of the mold compound insert package 11 allows a variety of liquid compounds to be used in molding, including the resin and epoxy materials of the prior art. Additionally, the use of the package allows the use of other materials, such as adhesives and abrasives not available in the pellet molding systems of the prior art. Some desirable compounds may have poor mold release characteristics, or may be extremely abrasive.

Figure 9:
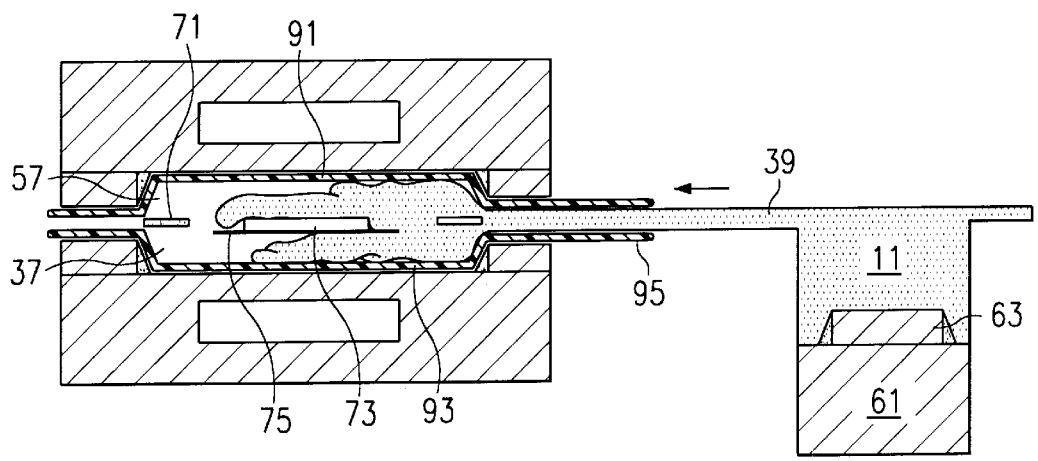
FIG. 9 depicts the molding process using the liquid mold compound and the release films of the invention.

FIG. 9 depicts the use of a mold release film with the prepackaged liquid molding compound of the invention to address these problems. In FIG. 9, a cross sectional view of the molding process using the prepackaged liquid mold compound insert with release films is shown. Again, top mold cavity 57 and bottom mold cavity 37 form a package cavity surrounding die 73, die pad 75, lead frame 71. Plunger 61 and tip 63 are shown in the receptacle. Mold compound insert 11 is shown supplying liquid mold compound to runner 39. Top release film 91 and bottom release film 93 are shown between the mold compound and the mold cavity surfaces.

In operation, the mold compound in use is one which should not contact the mold directly, either because it will abrade these surfaces or because it has poor mold release properties. In either case, the mold surfaces should be protected from the compound. Accordingly, a top release film is stretched across the top mold chase cavities 57. A corresponding bottom release film is stretched across the bottom mold chase cavities 37. The die and leadframe assemblies are placed over the bottom mold release film. The mold compound insert 11 is placed in the receptacle. The top and bottom molds are closed together to form the cavity as shown in FIG. 9.

The mold plunger is operated to press the mold compound through the seals of package 11 and into the runners. The mold compound enters the cavity formed by top cavity 57 and bottom cavity 37 and stretches the mold release film to the shape of the cavity so formed. The package cures wrapped with the mold release film. After curing, the mold is opened and the packaged die and mold release film are removed. The mold is completely clean and immediately ready for the next molding step.

The mold release films 91 and 93 should be of a material that has the ability to stretch and which has a melting point higher than the operating temperature of the mold. The mold typically will have an operating temperature of around 175 degrees Celsius. It is desirable that the mold release film have a melting point of greater than 200 degrees Celsius.

The mold release film should also be able to stretch. The heat of the mold will assist in this regard for some materials, but the material should not tear before or during the molding process. Therefore the material should be elastic and strong, even when stretching. Again, plastic films are available that meet this requirement. The film should be thin, typically less than 100 microns in thickness. If the packages being molded are thin packages, this thickness should be reduced. The film should not contaminate the mold or the package and should have a lower ionic concentration than that required for the mold compound. One film that is particularly well suited to these requirements is an ETFE film, a fluoroplastic film consisting of tetrafluoroethylene and ethylene. This film is available, for example, from Hoechst Aktiengesellschaft, Marketing Hostaflon, Frankfurt, Germany, and is labeled Hostaflon™ ET 6235 J and Hostaflon™ ET 6210 J. Other suitable ETFE films are commercially available from a variety of vendors.

In order to properly position the films in the cavities such that the gates remain open during the molding operation, the film may be stretched into the cavities using a vacuum. The vacuum additionally insures that the release film is positioned uniformly across the mold cavities such that the packages are formed in a uniform way.

An advantage of the prepackaged plastic liquid mold system of the invention is that is provides balanced fill capability. It can be seen that each primary runner and delivery runner is the same length. Also, because the cavities are all equidistant from the source of mold compound, receptacle, the problems of nonuniform fill and wire sweep associated with the single pot mold systems of the prior art are eliminated using the molding system of the invention. The design allows balanced cavity filling to be achieved.

Further, because the mold compound is prepackaged in a plastic encapsulation, the mold receptacle, the plunger, and to some extent the delivery runners are protected from the abrasive mold compound, so that the wear rate is greatly reduced. This results in longer mold life and reduced repair and replacement costs over the life of the mold surfaces, thus lowering the unit cost.

It can further be seen that as another advantage of the use of the invention, the mold receptacle takes a small amount of area compared to the large single pot and primary runners of the single pot transfer molds of the prior art. This is an advantage in that additional space is available for cavities and additional units may be molded during each run. The density for the system is improved over the prior art.

The mold design and mold compound package is also compatible with existing autoloading systems for transfer molds, so that the prepackaged molding system may be retrofitted into an existing automated transfer mold assembly line for a reasonable cost. The plunger design and mold design results in a need for two to four plungers per mold, which is cheaper to build and maintain than the multiple plungers needed for a mini-pellet multiple plunger system.

Further advantages are that the mold compound packages are reasonable in cost and may be produced in volume for a lower price per kilogram than the mini-pellets required by the prior art or the multiple packets required by the sprouted bag encapsulation system. It is believed that as the volume increases the prepackaged mold compound inserts of the invention may be produced at a price similar to the pellets of the single pot molding systems of the prior art.

Because the throughput rate of the prepackaged insert mold system is high, the number of stations required for a particular throughput rate is lower than the multiple plunger stations used with either the mini-pellet of the sprouted bag encapsulation systems of the prior art. Accordingly, the capital costs required to achieve a particular productivity level are less than either of these approaches.

Another advantage is that the mold compound system of the invention provides an efficient use of the molding compound. The runners are short from the receptacle to the cavities. The amount of mold compound left in the package can be minimized by careful design of the plunger so that almost all of the compound is transferred from the plastic package to the runners. The amount of sprue or flash left in the runners is far less than a single pot transfer mold and somewhat less than the mold compound waste resulting from a multiple pot multiplunger system.

The prepackaged liquid mold compound insert of the invention provides the flexibility of injection molding, that is using a variety of mold compounds, with the tight process control and economic advantages of the pellet transfer molding systems of the prior art. Further, the use of the release film enables use of molding compound materials previously unavailable, that is adhesive and abrasive compounds that would damage or hinder the operation of a molding station without the release film of the invention.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An apparatus for encapsulating integrated circuit devices, comprising:

a plurality of die cavities within at least one top mold chase, wherein said die cavities are a common distance from at least one rectangular mold compound receptacle;

at least one bottom mold chase, said top and bottom mold chases being in contact with one another;

a plurality of bottom die cavities within said at least one bottom mold chase, each corresponding to one of said top die cavities;

a plurality of integrated circuit die and leadframe assemblies positioned within said top and bottom die cavities and covered by a space defined by the corresponding one of said top die cavities;

said at least one mold compound receptacle containing a rectangular liquid mold compound insert comprising liquid mold compound prepackaged in a plastic film that has a heat seal which becomes permeable during the molding process such that the mold compound exits the plastic film through the heat seal during molding;

runners routed in parallel and coupling said at least one mold receptacle to said die cavities; and at least one plunger associated with said at least one mold receptacle for applying pressure to said mold compound insert within said receptacle, said mold compound being pushed into said runners and eventually filling said die cavities with mold compound in parallel such that said integrated circuits die and leadframe assemblies are encapsulated in said mold compound responsive to pressure applied by said plunger.

2. The apparatus of claim 1 wherein said mold compound comprises a thermoset resin.

3. The apparatus of claim 1 wherein said mold compound comprises a thermoset resin packaged in a plastic film.

4. The apparatus of claim 3 wherein said mold compound comprises a thermoset resin packaged in a plastic film that is heat sealed at the edges.

5. The apparatus of claim 3, wherein said mold compound comprises an epoxy material.

6. The apparatus of claim 3, wherein said liquid mold compound comprises an abrasive material.

7. An apparatus for encapsulating an integrated circuit die and leadframe in a mold compound, comprising:

a top mold chase;

a plurality of top die cavities within said top mold chase chase, wherein said die cavities are a common distance from at least one rectangular mold compound receptacle;

a bottom mold chase, said top and bottom mold chase being in contact with one another;

a plurality of bottom die cavities within said bottom mold chase, each corresponding to one of said top die cavities;

release film positioned over said top and bottom die cavities within said top and bottom mold chases, respectively, for protecting the surfaces of said top and bottom mold chases from mold compound;

a plurality of integrated circuit die and leadframe assemblies positioned within said top and bottom die cavities such that each die is centered over one of said bottom die cavities and covered by a space defined by the corresponding one of said top die cavities;

said at least one mold compound receptacle containing a rectangular liquid mold compound insert comprising liquid mold compound prepackaged in a plastic film which is sealed with a heat seal that becomes permeable during the molding process such that the mold compound exits the plastic package through the heat seal during the molding process;

parallel runners coupling said at least one mold receptacle to said bottom die cavities;

gates associated with each one of said bottom die cavities and positioned between said bottom die cavities and said runner; and at least one plunger associated with said at least one mold receptacle for applying pressure to said mold compound insert within said receptacle, said mold compound being pushed into said runners and eventually filling said die cavities with mold compound in parallel such that said integrated circuits die and leadframe assemblies are encapsulated in said mold compound responsive to pressure applied by said plunger.

8. The apparatus of claim 7, and further comprising:

vacuum ports in said top and bottom die cavities for providing a vacuum to partially stretch said release film into said top and bottom die cavities.

9. The apparatus of claim 8, wherein said release film comprises a fluoroplastic film.

10. The apparatus of claim 9, wherein said release film comprises a flouroplastic film of tetraflouroethylene film.

* * * * *